United States Patent
Schmid et al.

(10) Patent No.: US 9,293,260 B2
(45) Date of Patent: Mar. 22, 2016

(54) DIELECTRIC LAYER FOR AN ELECTRICAL COMPONENT, ELECTRICAL COMPONENT COMPRISING A DIELECTRIC LAYER AND METHOD FOR PRODUCING AN ELECTRICAL COMPONENT COMPRISING A DIELECTRIC LAYER

(75) Inventors: Günter Schmid, Hemhofen (DE); Dan Taroata, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 448 days.

(21) Appl. No.: 13/996,662

(22) PCT Filed: Dec. 8, 2011

(86) PCT No.: PCT/EP2011/072225
§ 371 (c)(1),
(2), (4) Date: Jun. 21, 2013

(87) PCT Pub. No.: WO2012/084536
PCT Pub. Date: Jun. 28, 2012

(65) Prior Publication Data
US 2013/0292167 A1    Nov. 7, 2013

(30) Foreign Application Priority Data
Dec. 21, 2010   (DE) .................. 10 2010 063 718

(51) Int. Cl.
*H01G 4/30*         (2006.01)
*B82Y 30/00*        (2011.01)
(Continued)

(52) U.S. Cl.
CPC    *H01G 4/30* (2013.01); *B82Y 30/00* (2013.01); *H01B 3/40* (2013.01); *H01B 3/447* (2013.01);
(Continued)

(58) Field of Classification Search
USPC .................... 361/327, 312, 314.512
See application file for complete search history.

(56) References Cited

U.S. PATENT DOCUMENTS 6,480,370 B1 * 11/2002 Koning .................. B82Y 10/00
257/40
2004/0054041 A1    3/2004 Schmidt
(Continued)

FOREIGN PATENT DOCUMENTS

DE        10100455       7/2002
DE      102009016659     6/2010
(Continued)

OTHER PUBLICATIONS

Hiroyuki Tokuda et al., "Physicochemical Properties and Structures of Room-Temperature Ionic Liquids. 3. Vaiation of Cationic Structures," Journal of Physical Chemistry, B 2006, 110, pp. 2833-2839.
(Continued)

*Primary Examiner* — William H Mayo, III
*Assistant Examiner* — Krystal Robinson
(74) *Attorney, Agent, or Firm* — Staas & Halsey LLP (57) ABSTRACT

An electrical component includes a first electrode layer, an organic insulating layer, which is arranged on the first electrode layer in a monolayer, an organic dielectric layer arranged on the organic insulating layer, and a second electrode layer, which is arranged on the dielectric layer. The electrical component is arranged on a circuit board substrate, a prepreg or a circuit board. The dielectric layer is formed from an ionic liquid, preferably in a polymer matrix.

16 Claims, 4 Drawing Sheets

(51) Int. Cl.
*H01B 3/40* (2006.01)
*H01B 3/44* (2006.01)
*H01G 4/18* (2006.01)
*H01G 4/33* (2006.01)
*H05K 1/16* (2006.01)
*H01G 9/035* (2006.01)
*H01L 51/05* (2006.01)

(52) U.S. Cl.
CPC . H01G 4/18 (2013.01); H01G 4/33 (2013.01); H05K 1/162 (2013.01); *H01G 9/035* (2013.01); *H01L 51/052* (2013.01); *H01L 51/0529* (2013.01); *H01L 51/0579* (2013.01); *H01L 51/0583* (2013.01); *Y10T 29/43* (2015.01)

(56) References Cited

U.S. PATENT DOCUMENTS

| 2005/0103706 | A1* | 5/2005 | Bennett | B82Y 30/00 210/500.27 |
| 2005/0167660 | A1* | 8/2005 | Klauk | H01G 4/18 257/40 |
| 2007/0206342 | A1 | 9/2007 | Tipton et al. | |
| 2008/0002329 | A1* | 1/2008 | Pohm | H01G 4/14 361/311 |
| 2010/0006794 | A1* | 1/2010 | Hawkins | H01G 9/2013 252/62.2 |
| 2011/0170227 | A1 | 7/2011 | Schmid et al. | |

FOREIGN PATENT DOCUMENTS

| JP | 2009-49397 | 3/2009 |
| WO | 2010/034597 | 4/2010 |

OTHER PUBLICATIONS

Hermann Weingärtner, "Zum Verständnis ionischer Flüssigkeiten auf molekularer Ebebene: Fakten, Probleme Und Kontroversen," Angew. Chemie, 102, 2008, pp. 664-682 and English Abstract.

German Office Action for Priority German Patent Application No. 10 2010 063 718.1, Issued Oct. 31, 2011, 6 pages.

English Language Translation of International Search Report for PCT/EP2011/072225, mailed Jan. 19, 2012, 3 pages.

PCT/EP2011/072225, Dec. 8, 2011, Guenter Schmid et al., Siemens AG.

DE 102010063718.1, Dec. 21, 2010, Guenter Schmid et al., Siemens AG.

* cited by examiner

DIELECTRIC LAYER FOR AN ELECTRICAL COMPONENT, ELECTRICAL COMPONENT COMPRISING A DIELECTRIC LAYER AND METHOD FOR PRODUCING AN ELECTRICAL COMPONENT COMPRISING A DIELECTRIC LAYER

CROSS REFERENCE TO RELATED APPLICATIONS

This application is based on and hereby claims priority to International Application No. PCT/EP2011/072225 filed on Dec. 8, 2011 and German Application No. 10 2010 063 718.1 filed on Dec. 21, 2010, the contents of which are hereby incorporated by reference.

BACKGROUND

The invention relates to an electrical component with a dielectric layer and to a process for producing an electrical component with a dielectric layer.

In printed circuit board manufacture, integration density is increasing to a high degree. For space-saving reasons, this results in the need to integrate passive components such as resistors or capacitors directly onto the printed circuit board. Such passive components should therefore be of maximum compactness in order to be able to optimally exploit the space available on a printed circuit board.

For the purposes of such miniaturization, it is therefore particularly advantageous to use ultrathin layers, especially monolayers, with precisely adjusted functionality in electronic components, especially also in organic electrical components. In order that molecules in monolayers self-assemble and thus exhibit maximum functionality and function density, it is advisable to fix them to the respective electrodes by head or anchor groups, as a result of which there is automatic alignment of the linker groups, i.e. of the groups connecting the two ends. The attachment to the substrate takes place spontaneously, provided that the substrate has been appropriately prepared. The specific functionality is determined by the linkers and head groups. The anchor determines the self-assembly.

Specifically capacitors are being used ever more frequently in printed circuit board manufacture, for example for printed circuit boards for computers or mobile communication components, in order to ensure a sufficient signal-to-noise ratio in the case of communication between the components. The ratio of capacitors and resistors used to be about 1:1, but the ratio is now about 3:1 on modern printed circuit boards.

SUMMARY

There is therefore a need for compact electrical components which can be manufactured efficiently and have a high integration density. Especially in the case of capacitors, there is a need for robust, reliable and in particular flat capacitors which nevertheless have a high capacity per unit area.

A basic idea of the inventorsis to provide an electrical component with an organic dielectric which can be produced in a parallel process on a prepreg or other standard printed circuit board substrates. This involves providing a self-assembly monolayer (SAM) with a protective layer of high dielectric constant, the protective layer comprising an ionic liquid in a polymer matrix. While the self-assembly monolayer (SAM) determines the electrical insulation and breakdown characteristics of the electrical component, the protective layer serves to increase the integration density of the electrical component.

The inventors therefore propose a dielectric layer for an electrical component comprising organic dielectric on a printed circuit board substrate (1), a prepreg or a printed circuit board, wherein the dielectric layer (4) comprises an ionic liquid, preferably in a polymer matrix. Ionic liquids have the advantage of having a high capacitance density in the DC voltage range or in the low-frequency voltage range, and hence of enabling a high dielectric constant of the dielectric of capacitive components combined with low layer thickness.

In one embodiment, the ionic liquid may comprise anions and alkylated cations, especially fluorophosphates, fluoroborates, phenylborates, sulfonylimides, triflates, bistriflylamides, sulfonates, chlorides, bromides and/or benzoates as anions and quaternary ammonium compounds such as alkylammonium, alkylated imidazolium and/or alkylated pyridinium, sodium ions, cesium ions and/or alkylated phosphonium as cations.

In one embodiment, the polymer matrix comprises resins based on epoxides, acrylates, urethanes or carbonates, polyesters, polyamides, polyimides, polybenzoxazoles, polyvinylidene difluorides, polyvinyl compounds, carbazoles, copolymers and/or block copolymers. The polymer matrix may optionally be crosslinked by melamine-co-formaldehyde.

The inventors further propose an electrical component comprising a first electrode layer, an organic insulation layer arranged in a monolayer on the first electrode layer, the dielectric layer mentioned above, arranged on the organic insulation layer, and a second electrode layer arranged on the dielectric layer.

The electrical component may preferably be arranged on a printed circuit board substrate, a prepreg or a printed circuit board, be an integrated capacitive component, for example a storage capacitor in an electronic circuit.

In one embodiment, the organic insulation layer comprises an organic compound for a self-assembly monolayer having an anchor group having a phosphonic acid or a phosphonic acid derivative for anchoring the organic compound to the first electrode layer and a linker group and a head group for the attachment to the dielectric layer. Such insulation layers are very flat and simultaneously offer excellent insulation and breakdown properties.

The inventors further propose a process for producing an electrical component, comprising:

applying an organic insulation layer to a pickled first electrode layer in a self-assembly monolayer;

applying an ionic liquid in a polymer matrix to the organic insulation layer to produce a dielectric layer; and applying a second electrode layer to the dielectric layer.

In one embodiment, the ionic liquid may be mixed with a polymer and applied to the organic insulation layer in an organic solvent. Preferably, the organic solvent is then vaporized to produce the dielectric layer. This offers the advantage of being able to produce simultaneously even and extremely dry dielectric layers.

In one embodiment, the dissolved mixture of an ionic liquid and a polymer can be applied by a rotary coating process, an inkjet printing process, a screen printing process or a spraying process.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

The configurations and developments described can be combined with one another as desired, if this is viable. Further possible configurations, developments and implementations also include combinations not specified explicitly of features which are described above or below with regard to the working examples.

The appended drawings are intended to impart further understanding of the embodiments. They illustrate embodiments and serve, in combination with the description, to explain principles and concepts. Other embodiments and many of the advantages mentioned are evident with regard to the drawings. Identical reference numerals refer to components which are identical or have a similar effect.

An organic compound for a self-assembly monolayer refers in the present context to compounds which become aligned in the layer because of a particular anchor group, such that a majority of the molecules is present with parallel and/or identical alignment in the layer. Many commercially available materials may be employed and used for the production of compact monolayers.

Figure 1:
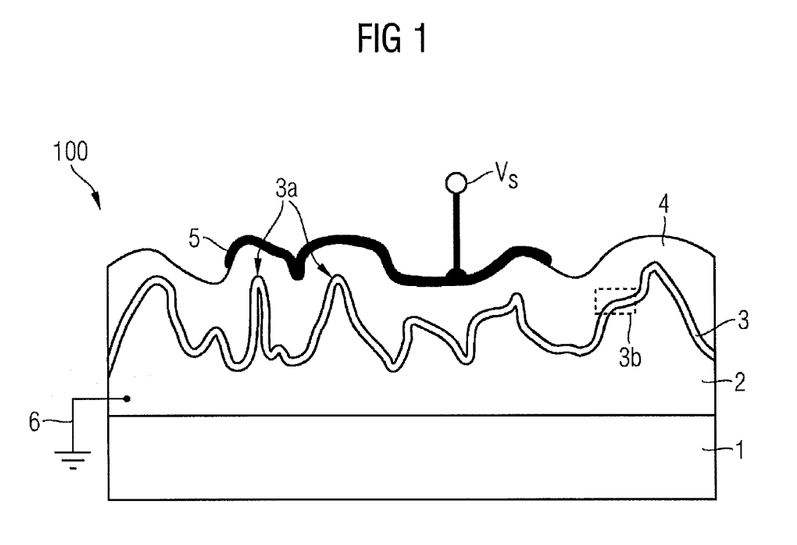
FIG. 1 is a schematic diagram of an electrical component in one embodiment of the proposal.

FIG. 1 shows a schematic diagram of an electrical component 100 in one embodiment of the proposal. By way of example, FIG. 1 shows a capacitor 100 applied to a printed circuit board substrate 1. The printed circuit board substrate 1 may be any standard printed circuit board substrate. It may also be possible to apply the capacitor 100 to a prepreg, a printed circuit board or a similar substrate.

Figure 2:
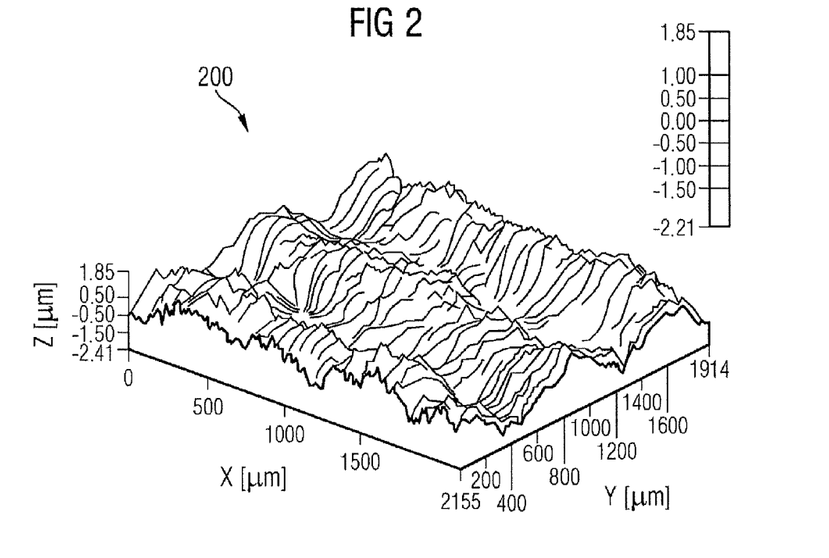
FIG. 2 is a schematic diagram of the roughness of a pickled printed circuit board substrate of an electrical component in a further embodiment of the proposal.

The base material used for the capacitor 100 is a metal layer 2 pickled by standard methods. The metal layer 2 may, for example, comprise copper arranged on the printed circuit board substrate 1 in an applied layer of about 5 to 30 µm with a roughness in the pm range. The pickling can be effected, for example, by degreasing with organic solvents and subsequent surface etching with peroxodisulfates and sulfuric acid. FIG. 2 illustrates, by way of example, the roughness 200 of a pickled metal layer 2.

Additional cleaning of the metal surface 2 can be effected, for example, by a cathodic process. For this purpose, the printed circuit board substrate 1 can be connected as the cathode in dilute sodium carbonate solution and be cleaned by the hydrogen which forms at a current flow rate of 10 to 100 mA/cm$^2$.

As a result of the pickling, the contact angle with respect to water is less than 5°. As a result, the metal surface 2 becomes very hydrophilic. Reference is made hereinafter by way of example to copper as the metal for the metal layer 2. To prevent the oxidation of the copper, and as a primer for the subsequent thin polymer deposition for merely local planarization, a monolayer 3 of an organic phosphonic acid is deposited immediately thereafter.

Preference is given to the long-chain phosphonic acids, such as decyl- to octadecylphosphonic acid, generally $CH_3$—$(CH_2)_n$—$PO(OH)_2$ where n=8–25, preferably n=18. The molecular chain may also take the form of a polyether chain (—O—$CH_2$—$CH_2$—O—)$_m$ where m is from 1 to 20, preferably from 2 to 10. The contact angle with respect to water, after deposition of an octadecylphosphonic acid, increases to >130° for alkylphosphonic acids and is thus an indication of the quality of the deposition. The alkyl chains may also be entirely or partially fluorinated.

Alternatively, the deposition can be effected via the phosphonic esters or salts thereof or other derivatives such as amines or the like. The salts can be obtained directly in solution by addition of relatively small or equivalent amounts of alkyl (NaOH, KOH, ammonia or ammonium hydroxides).

The head groups used may be the simplest branched or unbranched alkyl groups, or alkenyl groups suitable for further reactions, for example for crosslinking. The head group may be a fluorine, nitrile, amino, ester, aldehyde, epoxy or acid function. In the case of a fluorination, the head group may be —$CF_3$, —$CHF_2$ or —$CH_2F$.

Figure 1A:
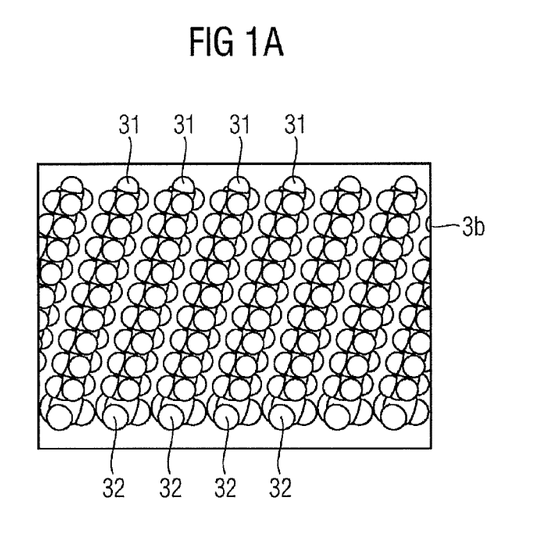
FIG. 1a is a schematic diagram of a detailed section of the structure of the electrical component as per FIG. 1 in a further embodiment of the proposal.

FIG. 1a shows a detailed section of the monolayer 3 in FIG. 1. The organic compounds are aligned substantially parallel to one another in a self-assembled manner, the anchor group 32 binding the organic compounds to the metal layer 2, and the head group 31 connected to the anchor group via a linker group enabling binding to a dielectric layer which is to be applied to the monolayer 3. Especially at sites of high surface curvature 3a of the surface of the metal layer 2, the monolayer 3 may provide good insulation.

To increase the mechanical stability, a dielectric layer 4 which is used for local planarization of the metal layer 2 is applied to the monolayer 3 for stabilization and/or for the local planarization of the capacitor 100.

The leakage current characteristics and the reliability of the capacitor 100 are determined almost exclusively by the self-assembly monolayer 3. Therefore, planarization can be accomplished by using virtually any polymers, provided that they are compatible with the printed circuit board operations. More particularly, it may be advantageous to keep the dielectric layer 4 as flat as possible, preferably less than 1000 nm, especially less than 500 nm. For the formation of the dielectric layer 4, wet-chemical processes, for example spin-coating, inkjet printing, screen printing, dipping, curtain coating, bar coating or similar processes are suitable.

In the case of use of conventional polymers, an effective layer thickness of the dielectric layer 4 of about 550 to 600 nm is obtained, for example an integration density of about 50 pF/mm$^2$ with a dielectric constant of 3.17. These values may of course vary according to the polymers used. In order to achieve integration densities exceeding 200 pF/mm$^2$, the dielectric constant, however, must be significantly higher.

Therefore, an ionic liquid in a polymer matrix is used to form the dielectric layer 4. It is possible to employ a multitude of conventional polymers for formation of the polymer matrix.

As well as novolac-type polymers, it is also possible to use resins based on epoxides, acrylates, urethanes or carbonates for formation of the polymer matrix of the dielectric layer 4. Further possible polymers include polyesters, polyamides, polyimides, polybenzoxazoles, polyvinylidene difluoride and other Teflon-like materials, polyvinyl compounds such as carbazoles, alcohols and esters thereof. Copolymers or block copolymers such as acrylonitrile-butadiene-styrene copolymers (ABS) are likewise suitable. The molar mass of the polymers may be in the range between $10^2$ and $10^8$.

The ionic liquids used for formation of the dielectric layer 4 may be liquids which may have anions and alkylated cations. For example, the anions used may be fluorophosphates, fluoroborates, phenylborates, sulfonylimides, triflates, bistriflylamides, sulfonates, chlorides, bromides and/or benzoates. The alkylated cations used may, for example, be quaternary ammonium compounds or alkylated phosphonium. Quaternary ammonium compounds may comprise, for example, alkylammonium, alkylated imidazolium or alkylated pyridinium. It may also be possible to use sodium ions or cesium ions as cations.

Specific examples of ionic liquids used for formation of the dielectric layer are 1-benzyl-3-methylimidazolium hexafluorophosphate, 1-butyl-2,3-dimethylimidazolium hexafluorophosphate, 1-butyl-3-methylimidazolium hexafluorophosphate, 1-ethyl-3-methylimidazolium hexafluorophosphate, 1-hexyl-3-methylimidazolium hexafluorophosphate, 1-butyl-1-(3,3,4,4,5,5,6,6,7,7,8,8,8-tridecafluorooctyl)imidazolium hexafluorophosphate, 1-methyl-3-(3,3,4,4,5,5,6,6,7,7,8,8,8-tridecafluorooctyl)imidazolium hexafluorophosphate, 1-methyl-3-octylimidazolium hexafluorophosphate, 1-butyl-2,3-dimethylimidazolium tetrafluoroborate, 1-butyl-3-methylimidazolium tetrafluoroborate, 1-ethyl-3-methylimidazolium tetrafluoroborate, 1-hexyl-3-methylimidazolium tetrafluoroborate, 1-methyl-3-octylimidazolium tetrafluoroborate, 1-butyl-3-methylimidazolium trifluoromethanesulfonate, 1-ethyl-3-methylimidazolium trifluoromethanesulfonate, 1,2,3-trimethylimidazolium trifluoromethanesulfonate, 1-butyl-3-methylimidazolium methanesulfonate, 1-ethyl-3-methylimidazolium bis(pentafluoroethylsulfonyl)imide, 1-butyl-3-methylimidazolium bis(trifluoromethylsulfonyl)imide, tetrabutylammonium bis(trifluoromethanesulfonimidate), tetrabutylammonium methanesulfonate, tetrabutylammonium nonafluorobutanesulfonate, tetrabutylammonium heptadecafluorooctanesulfonate, tetrabutylammonium tetrafluoroborate, tetrabutylammonium trifluoromethanesulfonate, tetrabutylammonium benzoate, tetrabutylammonium chloride, tetrabutylammonium bromide, tetrabutylammonium fluoride, 1-benzyl-3-methylimidazolium tetrafluoroborate, trihexyltetradecylphosphonium hexafluorophosphate, tetrabutylphosphonium methanesulfonate, tetrabutylphosphonium tetrafluoroborate, tetrabutylphosphonium bromide, tetrabutylphosphonium fluoride, tetrabutylphosphonium chloride, 1-butyl-3-methylpyridinium bis(trifluoromethylsulfonyl)imide, 1-butyl-4-methylpyridinium hexafluorophosphate, 1-butyl-4-methylpyridinium tetrafluoroborate, sodium tetraphenylborate, tetrabutylammonium tetraphenylborate, sodium tetrakis(1-imidazolyl)borate and cesium tetraphenylborate. It will be appreciated that the abovementioned examples constitute merely a small selection of the possible ionic liquids for formation of a dielectric layer 4, and that other unspecified examples may likewise be suitable for this purpose. For example, it is also possible to use organometallic-based ionic liquids.

In order to obtain a dry and stable dielectric layer 4, a mass ratio of polymer to ionic liquid in the range between 1:10 and 10:1 may be used. It may also be possible to provide only one suitable ionic liquid for formation of the dielectric layer 4.

The dielectric layer 4 may be applied, for example, from a solution. For this purpose, it is possible to dissolve 1 to 50%, preferably 5 to 20%, of the polymer with or without crosslinker in an organic solvent, for example propylene glycol monoethyl ether acetate (PGMEA), tetrahydrofuran, dioxane, chlorobenzene, diethylene glycol diethyl ether, diethylene glycol monoethyl ether, gamma-butylrolactone, N-methylpyrrolidone, ethoxyethanol, xylene, toluene or similar solvents, and to apply it in appropriate thickness by spin-coating, screen printing, inkjet printing, spraying or similar processes. Thereafter, the solvent is vaporized by heating, leaving the dry or cured dielectric layer 4. The polymers can be crosslinked by a thermal or photochemical process. The crosslinking is optional, possible crosslinkers being photoacids. For example, the crosslinker used for novolac-type systems may be melamine-co-formaldehyde. The crosslinking can preferably be performed within the temperature range between 180° C. and 230° C. After the crosslinking the dielectric layer, for mechanical stabilization, is no longer attacked by solvents.

In the case of use of acrylates and epoxides, the monomers or oligo compounds can be applied by spin-coating or printing and subsequently crosslinked thermally or photochemically to give the dielectric layer 4.

A second electrode layer 5 may be applied to the dielectric layer 4. The second electrode layer 5 can therefore be connected to a supply potential $V_s$, such that, when the first electrode layer 2 is connected to a second potential 6, for example a ground potential, the capacitor 100 is formed. The second electrode layer 5 used for the capacitor 100 may be any metal or alloy thereof or conductive metal-containing printing pastes. Likewise suitable are organic conductors, such as PEDOT (polystyrenesulfonic acid-doped polydiethoxythiophene) or PANI (camphorsulfonic acid-doped polyaniline). Particular preference is given, however, to the following metals utilized in the printed circuit board industry: copper, aluminum, nickel, gold and silver or alloys thereof. Metal counterelectrodes applied over the full area can subsequently be structured by known etching and mechanical ablation processes, for example with a laser. If a plurality of capacitors 100 are provided with a common electrode layer 5, the electrode layer 5 can also be deposited from the gas phase by shadow masks.

The second electrode layer 5 can also be applied by electroless metallization after local seeding or seeding over the full area. For this purpose, it is possible to use all standard processes in the printed circuit board industry, since the dielectric layer 4, especially after crosslinking, is compatible with the customary media in the printed circuit board industry.

The envisaged construction of an electrode layer with a subsequent insulator layer can be used advantageously not just in a capacitor as shown by way of example in FIG. 1; it is also suitable in principle as a gate dielectric for organic field-effect transistors for direct integration into the printed circuit board, as a substrate for top-emitting OLEDs (organic light-emitting diodes) or for solar cells.

An example is given hereinafter for a production process for an electrical component comprising an organic dielectric using an ionic liquid in a polymer matrix.

An FR4 circuit board laminated with 30 µm of copper is cut to a size of 50×50 mm². This blank is first freed of grease with acetone and isopropanol. A commercial photoresist (TMSR8900) is applied by spin-coating at 6000 revolutions for 20 s and dried on a hot plate at 110° C. for 60 s. The photoresist is exposed with UV light of wavelength 365 nm for 7 s and developed in aqueous alkaline developer for 60 s. After the photostructuring, pickling is effected in a 5% ammonium peroxodisulfate solution at 40° C. for 3 min. After rinsing with water and isopropanol, the circuit board is placed into a solution of octadecylphosphonic acid (0.2-0.25 g) in isopropanol (100 ml). After 12 hours, the circuit board is rinsed with isopropanol and dried at 100° C. in a nitrogen stream for 1 min.

After pickling, the contact angle with respect to water is 1° to 4°. After the deposition of the octadecylphosphonic acid, the contact angle is 135°, which suggests excellent coverage of the copper layer.

Figure 3:
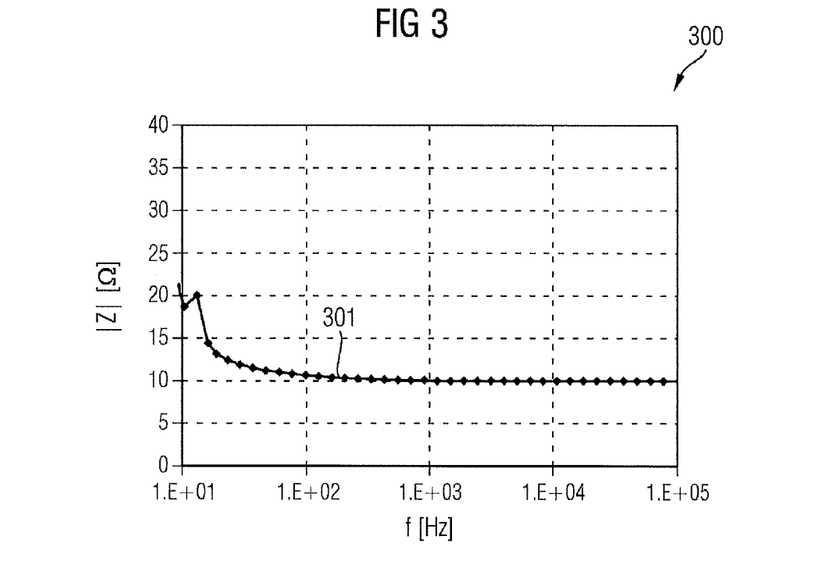
FIG. 3 shows a frequency plot of the magnitude of the impedance of an electrical component in a further embodiment of the proposal.
Figure 4:
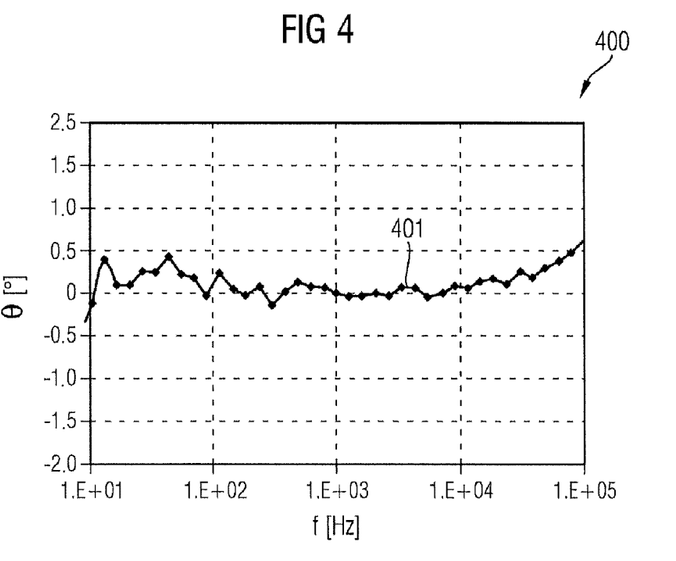
FIG. 4 shows a frequency plot of the phase of the impedance of an electrical component in a further embodiment of the proposal.

If, thereafter, 100 nm of aluminum are then applied by vapor deposition through a shadow mask directly onto the monolayer of octadecylphosphonic acid as a counterelectrode, it is found at first that the capacitors thus produced are short-circuited. This is shown by the characteristics shown in FIGS. 3 and 4. The electrical characteristics have a magnitude |Z| of about 10 Ω and a phase angle θ of the impedance Z of about 0°, meaning that the capacitor does not work.

To produce a working capacitor, it is therefore necessary to apply a dielectric layer to the monolayer of octadecylphosphonic acid. For this purpose, a second dielectric layer is applied by spin-coating at a rotation speed of 1000 rpm. The film thus formed is dried at a temperature of 180° in a vacuum oven. For the second dielectric layer, for example, a mixture of 70% by weight of PGMEA, 20% by weight of poly(4-vinylphenol) and 10% by weight of 1-butyl-3-methylimidazolium hexafluorophosphate ($BMIM-PF_6$) can be used.

Figure 5:
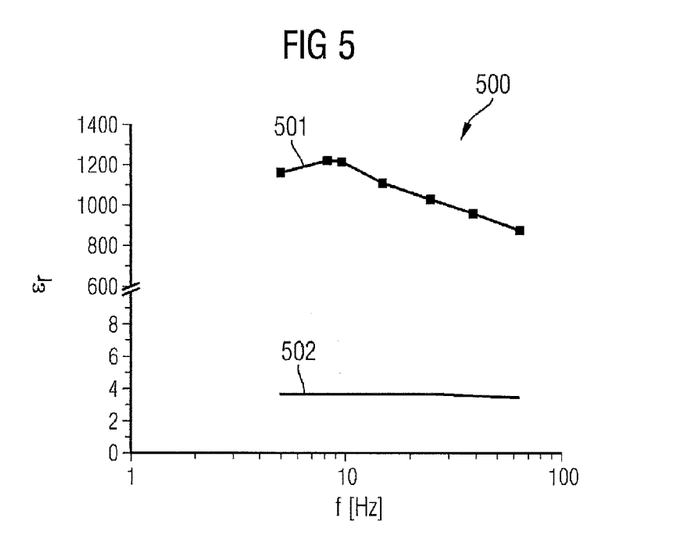
FIG. 5 shows a frequency plot of the relative dielectric constant of an electrical component in a further embodiment of the proposal.

FIG. 5 shows, in a frequency diagram 500, the frequency plot 501 of the relative dielectric constants $\in_r$ of the dielectric layer of thickness 1800 nm thus obtained, which have been determined with the aid of profilometer measurements. Thinner layers are attainable by variation of the rotation parameters and the solids content in the solution. Over a large frequency range f from about 1 to 100 Hz, the dielectric layer formed from an ionic liquid in a polymer matrix has a very high relative dielectric constant $\in_r$ of about 800 to 1200.

As a reference, the frequency plot 502 of the relative dielectric constant $E_r$ of a pure polymer layer formed from 80% by weight of PGMEA and 20% by weight of poly(4-vinylphenol) is shown, this having a thickness of 1200 nm. It can be seen in FIG. 5 that the relative dielectric constant $\in_r$ of the dielectric layer comprising an ionic liquid in a polymer matrix in low frequency ranges is higher by a factor of more than 400 than that of the reference layer, which is caused by the introduction of the $BMIM-PF_6$. With rising frequency, because of the limited mobility of the ions in the polymer matrix, the response of the polarization can no longer follow the change in the electrical field. In the frequency range above 10 kHz, the relative dielectric constant $\in_r$ therefore falls to a value corresponding to the pure polymer layer.

For applications as a storage capacitor in electronic circuits, however, use of these capacitive components at high frequencies is unnecessary.

The dependence of the capacitance on the electrode area is strictly linear in the capacitive components thus produced. This shows that even large-area capacitances, for example up to an area of 20 mm², can be produced. The correlation between capacitance and electrode area for values between 0.19 mm² and 20 mm² is very good with a mean square correlation coefficient of more than 0.99.

Figure 6:
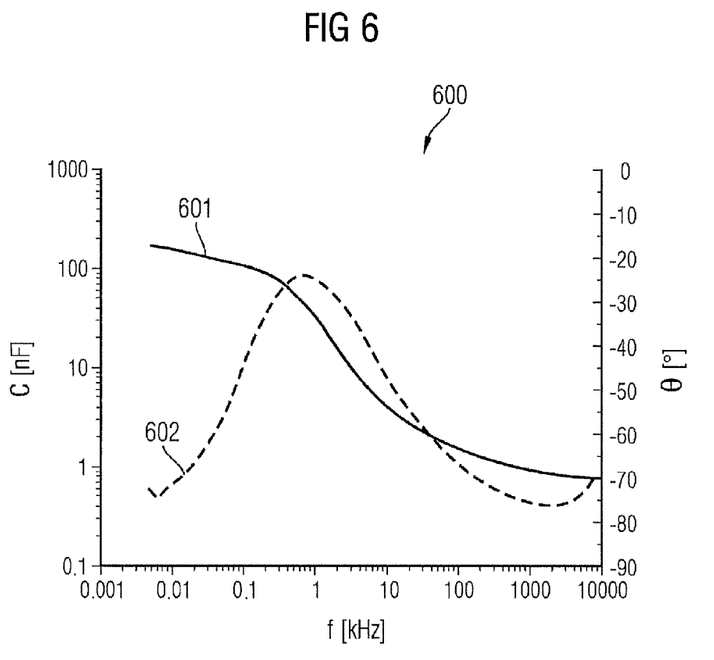
FIG. 6 shows a frequency plot of the capacitance and phase angle of a capacitor in a further embodiment of the proposal.

FIG. 6 shows, in a diagram 600, the frequency plot 601 of the capacitance C and the frequency plot 602 of the phase angle θ of a capacitor comprising a dielectric layer which comprises $BMIM-PF_6$-poly(4-vinylphenol) and has been produced according to the above example and having an electrode area of 1 mm². In the low frequency range, a very high capacitive integration density of more than 100 nF/mm² is attained. With rising frequency, the dielectric losses also rise, and the integration density falls down to about 1 nF/mm².

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. An electrical component comprising:
    a first electrode layer;
    an organic insulation layer arranged in a monolayer on the first electrode layer;
    a dielectric layer arranged on the organic insulation layer; and
    a second electrode layer arranged on the dielectric layer, wherein the dielectric layer comprises an ionic liquid.

2. The electrical component as claimed in claim 1, wherein the electrical component is arranged on a printed circuit board substrate, a prepreg or a printed circuit board, and wherein the electrical component is an integrated capacitive component.

3. The electrical component as claimed in claim 2, wherein the electrical component is a storage capacitor in an electronic circuit.

4. The electrical component as claimed in claim 1, wherein the organic insulation layer comprises an organic compound for a self-assembly monolayer.

5. The electrical component as claimed in claim 4, wherein the organic compound comprises:
    an anchor group having a phosphonic acid or a phosphonic acid derivative, for anchoring the organic compound to the first electrode layer;
    a linker group; and
    a head group for attachment to the dielectric layer.

6. The electrical component as claimed in claim 1, wherein the ionic liquid is embedded in a polymer matrix.

7. The electrical component as claimed in claim 6, wherein the polymer matrix comprises a resin based on at least one compound selected from the group consisting of epoxides, acrylates, urethanes, carbonates, polyesters, polyamides, polyimides, polybenzoxazoles, polyvinylidene difluorides, polyvinyl compounds, and carbazoles.

8. The electrical component as claimed in claim 7, wherein the resin is a copolymer or block copolymer.

9. The electrical component as claimed in claim 7, wherein the polymer matrix is crosslinked by melamine-co-formaldehyde.

10. The electrical component as claimed in claim 1, wherein the ionic liquid comprises anions and alkylated cations.

11. The electrical component as claimed in claim 10, wherein the anions are selected from the group consisting of fluorophosphates, fluoroborates, phenylborates, sulfonylimides, triflates, bistriflylamides, sulfonates, chlorides, bromides and benzoates.

12. The electrical component as claimed in claim 10, wherein the alkylated cations are selected from the group consisting of quaternary ammonium compounds, sodium ions, cesium ions and alkylated phosphonium.

13. The electrical component as claimed in claim 10, wherein the alkylated cations comprise a quaternary ammonium compound selected from the group consisting of alkylammonium, alkylated imidazolium and alkylated pyridinium.

14. A process for producing an electrical component, comprising:
   applying an organic insulation layer to a pickled first electrode layer, the organic insulation layer being applied as a self-assembly monolayer;
   applying an ionic liquid in a polymer matrix to the organic insulation layer to produce a dielectric layer; and
   applying a second electrode layer to the dielectric layer.

15. The process as claimed in claim 14, wherein applying the ionic liquid in a polymer matrix comprises:
   applying a mixture of the ionic liquid and a polymer dissolved in an organic solvent to the organic insulation layer; and
   vaporizing the organic solvent to produce the dielectric layer.

16. The process as claimed in claim 15, wherein a rotary coating process, an inkjet printing process, a screen printing process or a spraying process is used to apply the mixture of the ionic liquid and the polymer dissolved in the organic solvent.

* * * * *